(12) United States Patent
Loechelt

(10) Patent No.: US 7,732,862 B2
(45) Date of Patent: Jun. 8, 2010

(54) POWER SEMICONDUCTOR DEVICE HAVING IMPROVED PERFORMANCE AND METHOD

(75) Inventor: Gary H. Loechelt, Tempe, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 679 days.

(21) Appl. No.: 11/384,161

(22) Filed: Mar. 20, 2006

(65) Prior Publication Data

US 2007/0215914 A1    Sep. 20, 2007

(51) Int. Cl.
*H01L 29/94* (2006.01)

(52) U.S. Cl. .................. 257/339; 257/328; 257/341; 257/342; 257/E29.027; 257/E29.066; 257/E29.121

(58) Field of Classification Search .................. 257/327, 257/328, 339, 341, 342, E29.027, E29.066, 257/E29.118, E29.121
See application file for complete search history.

(56) References Cited

U.S. PATENT DOCUMENTS

| 6,197,640 | B1 | 3/2001 | Davies |
| 6,870,221 | B2 | 3/2005 | Venkatraman |
| 2005/0121720 | A1 * | 6/2005 | Sin et al. ..................... 257/341 |

FOREIGN PATENT DOCUMENTS

WO    2004/053999    6/2004

* cited by examiner

*Primary Examiner*—Matthew E Warren
(74) *Attorney, Agent, or Firm*—Kevin B. Jackson

(57) ABSTRACT

In one embodiment, a semiconductor device is formed in a body of semiconductor material. The semiconductor device includes an offset body region.

14 Claims, 8 Drawing Sheets

POWER SEMICONDUCTOR DEVICE HAVING IMPROVED PERFORMANCE AND METHOD

FIELD OF THE INVENTION

This invention relates generally to semiconductor devices, and more specifically to power devices such as power management and switching devices and methods of their manufacture.

BACKGROUND OF THE INVENTION

Metal-oxide semiconductor field effect transistors (MOSFETs) are a common type of power switching device. A MOSFET device includes a source region, a drain region, a channel region extending between the source and drain regions, and a gate structure provided adjacent to the channel region. The gate structure includes a conductive gate electrode layer disposed adjacent to and separated from the channel region by a thin dielectric layer.

When a MOSFET device is in the on state, a voltage is applied to the gate structure to form a conduction channel region between the source and drain regions, which allows current to flow through the device. In the off state, any voltage applied to the gate structure is sufficiently low so that a conduction channel does not form, and thus current flow does not occur. During the off state, the device must support a high voltage between the source and drain regions.

In optimizing the performance of MOSFET devices, designers often are faced with trade-offs in device parameter performance. Specifically, available device structure or fabrication process choices may improve one device parameter, but at the same time such choices may degrade one or more other device parameters. For example, available structures and processes that improve the output or drive current ($I_{DS}$) capability and on resistance of a MOSFET device also degrade its breakdown voltage ($BV_{DSS}$) capability and increase gate to drain capacitance. Additionally, the reduction in device cell size is limited by the encroachment of adjacent body regions or other doped regions, which can create a JFET effect that pinches the current flow in the drain region. In order to avoid totally cutting off the current path in present devices, cell size must be increased, which is counter to a desire to produce smaller devices.

Accordingly, improved semiconductor device structures and methods of their manufacture are needed to address the above mentioned issues as well as others.

For simplicity and clarity of illustration, elements in the figures are not necessarily to scale, and the same reference numbers in different figures generally denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-channel devices, a person of ordinary skill in the art will appreciate that complementary devices are also possible in accordance with the present invention. For clarity of the drawings, doped regions of device structures are illustrated as having generally straight line edges and precise angular corners. However, those skilled in the art understand that due to the diffusion and activation of dopants the edges of doped regions are generally not straight lines and the corners are not precise angles.

DETAILED DESCRIPTION OF THE DRAWINGS

The device and method of the present invention may embody either a cellular design (where the body regions are a plurality of cellular regions) or a single body design (where the body region is comprised of a single region formed in an elongated pattern, typically in a serpentine pattern). However, the device of the present invention will be described as a cellular design throughout the description for ease of understanding. It should be understood that it is intended that the present invention encompass both a cellular design and a single base design.

Figure 1:
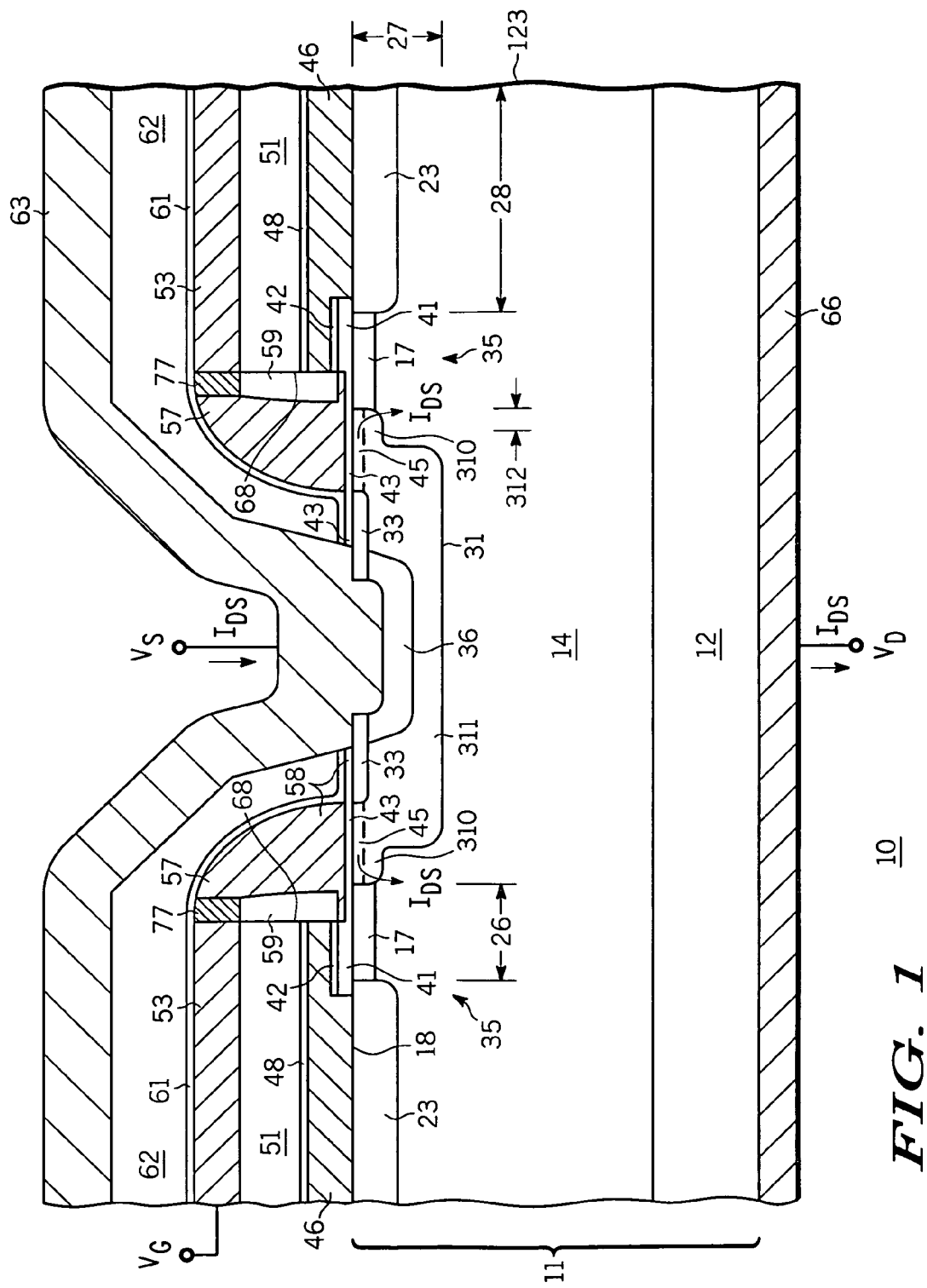
FIG. 1 illustrates a highly enlarged partial cross-sectional view of a semiconductor structure in accordance with an embodiment of the present invention.

FIG. 1 shows an enlarged partial cross-sectional view of an insulated gate field effect transistor (IGFET), MOSFET, power transistor, or switching device or cell 10 in accordance with an embodiment of the present invention. By way of example, device 10 is among many such devices or cells integrated with logic and/or other components into a semiconductor chip as part of a power integrated circuit. Alternatively, device 10 is among many such devices or cells integrated together to form a discrete transistor device.

Device 10 includes a region of semiconductor material 11, which comprises for example, an n-type silicon substrate 12 having a resistivity in range of approximately 0.001 to about 0.005 ohm-cm, and may be doped with arsenic. In the embodiment shown, substrate 12 provides a drain contact or a first current carrying contact. A semiconductor layer or extended drain region 14 is formed in or overlying substrate 12. In one embodiment, semiconductor layer 14 is formed using conventional epitaxial growth techniques. Alternatively, semiconductor layer 14 is formed using conventional doping and diffusion techniques. In an embodiment suitable for a 50 volt device, semiconductor layer 14 is n-type with a dopant concentration of about $1.0\times10^{15}$ atoms/cm$^3$, and has a thickness on the order of about 3 microns to about 5 microns. The thickness and dopant concentration of semiconductor layer 14 is increased or decreased depending on the desired $BV_{DSS}$ rating of device 10. It is understood that other materials may be used for body of semiconductor material 11 or portions thereof including silicon-germanium, silicon-germanium-carbon, carbon doped silicon, silicon carbide, or the like. Additionally, in an alternate embodiment, the conductivity type of substrate 12 is switched to be opposite the conductivity type of semiconductor layer 14 to form an insulated gate bipolar transistor 10.

Device 10 also includes an n-type region or blanket layer 17 formed in or adjacent to upper or major surface 18 of semiconductor material 11. N-type region 17 provides a low resistance current path for device 10. In an exemplary embodiment, n-type region 17 has a maximum concentration on the order of about $6.0\times10^{16}$ atoms/cm$^3$, and depth of about 0.4 microns.

In accordance with the present invention, device 10 further includes a stepped or offset body, base, or doped region 31 formed in semiconductor layer 14 and extending from or adjacent to major surface 18. In the present invention, offset body region 31 comprises multiple parts with a first, wider or shallow part or portion 310 adjacent or adjoining to major surface 18, and a second, narrower or deep part or portion 311 spaced apart from major surface 18 and underneath, underlying, or at least partially below first part 310. Further, first part 310 is wider than second part 311, or second part 311 is stepped-in or offset inwards from first part 310. Preferably, second part 311 is stepped-in from all sides of first part 310. In semiconductor devices of the past, offset body region 31 is not formed. Rather, a simple body with a single region without any offset of the deeper portion is formed in prior devices.

By way of example, offset body region 31 comprises p-type conductivity, and has a dopant concentration suitable for forming an inversion layer that operates as conduction channels 45 of device 10, which are formed in first part 310. Second part 311 of offset body region 31 extends from major surface 18 to a depth, for example, of about 0.5 microns to about 3.0 microns. First part 310 of offset body region 31 extends from major surface 18 to a depth of about 0.1 microns to about 1.5 microns, and is shallower than second part 311.

In one embodiment, deep portion 311 is recessed or offset from shallow portion 310 a distance 312 of about 0.3 microns on all sides. That is, in one embodiment portion 310 is about or at least 0.6 microns wider than portion 311. The offset feature of body region 31 is believed to enable the size of cell 10 to be reduced without causing a pinch-off of JFET region 35. It is further believed that the offset feature provides a more vertical or nearly vertical flow of current ($I_{DS}$) leaving channel 45. As will be shown below, the offset feature of the present invention has an equivalent breakdown voltage (FIG. 2), enhanced drain current (FIG. 3), and improved drain resistance (FIG. 4) compared to a device having a standard or non-offset body region. As will be further explained below in conjunction with FIGS. 5-9, the integration of the offset feature of the present invention is done in as few as three process steps.

Device 10 further includes an n-type source region, current conducting, or current carrying region 33 formed within or in offset body region 31 and extends from major surface 18 to a depth, for example, of about 0.1 microns to about 0.5 microns. A p-type body contact or contact region 36 is also formed in offset body region 31, and provides a lower contact resistance to offset body region 31 at major surface 18. In addition, contact region 36 lowers the sheet resistance of offset body region 31 under source region 33, which suppresses parasitic bipolar effects.

A first dielectric layer 41 is formed over or adjoining portions of major surface 18. For example, dielectric layer 41 comprises a thermal oxide layer having a thickness of about 0.05 microns to about 0.2 microns. A second dielectric layer 42 is formed over dielectric layer 41. In one embodiment, second dielectric layer 42 comprises silicon nitride, and has a thickness of about 0.05 microns to about 0.1 microns.

Gate dielectric layers 43 are formed over or adjoining other portions of major surface 18 adjacent to offset body region 31. Gate dielectric layers 43 comprise for example, silicon oxide, and have a thickness of about 0.01 microns to about 0.1 microns. In alternative embodiments, gate dielectric layers 43 comprise silicon nitride, tantalum pentoxide, titanium dioxide, barium strontium titanate, or combinations thereof including combinations with silicon oxide, or the like.

Conductive spacer gate regions, vertical spacer gate regions, or spacer defined gate regions or conductive electrodes 57 are formed over gate dielectric layers 43, and are isolated from conductive layers 46 by dielectric spacers 59. Conductive spacer gate regions 57 together with gate dielectric layers 43 form a control electrode or gate structure 58. Conductive spacer gate regions 57 comprise, for example, n-type polycrystalline silicon or polysilicon, and are about 0.2 microns to about 0.8 microns in thickness. In an exemplary embodiment, dielectric spacers 59 comprise silicon nitride, and are about 0.1 microns in thickness. Spacer gate regions 57 are coupled to conductive layer 53 to provide a conductive gate structure, which controls the formation of channels 45 and the conduction of current in device 10. In the embodiment shown, a conductive connective portion 77 couples spacer gate regions 57 to conductive layers 53. Conductive connective portions 77 comprise for example, n-type polysilicon. A spacer defined gate region refers to a control electrode formed with gate material deposited on one surface to control a channel formed on another perpendicular surface. In the case of device 10, channels 45 are formed at major surface 18, which is considered a horizontal surface. The control electrode film used to form spacer gate regions 57 is deposited along vertical surfaces 68, which are perpendicular to surface 18.

A doped polycrystalline semiconductor layer or conductive layer 46 is formed over dielectric layers 41 and 42, and coupled to a doped region or counter-doped drain region 23 formed in body of semiconductor material 11. In an exemplary embodiment, conductive layer 46 comprises a polysilicon layer, has a thickness of about 0.1 microns, and has p-type conductivity for an n-channel device. When heat treated, p-type dopant from conductive layer 46 diffuses into body of semiconductor material 11 to form doped regions 23. In an alternative embodiment, doped regions 23 are formed using ion implantation techniques. In an alternative embodiment, conductive layer 46 comprises amorphous silicon, a metal, a silicide, or combinations thereof including combinations with polysilicon. If a metal is used for conductive layer 46, p-type dopant is first implanted or deposited into body of semiconductor material 11 to form doped regions 23. Conductive layer 46 is left floating or is coupled to a fixed potential such as $V_S$ or ground.

Conductive spacer gate regions 57 provide a minimal gate to drain overlap compared to conventional devices, thereby significantly reducing gate charge. Additionally, in device 10 the electrical routing for the gate is provided by conductive layer 53, which is elevated above major surface 18 thereby further reducing gate charge. Further, conductive layer 46 functions, among other things, as a ground plane or shield layer interposed between the gate and drain regions to further reduce gate to drain capacitance. These features provide enhanced switching speed and reduced input charge requirements.

Doped regions 23 are spaced a distance 26 that is on the same order as the second portion 311 of body region 31 to drain junction depth 27. In one embodiment, doped regions 23 are spaced a distance 26 from about 0.5 microns to about 3.0 microns from first portion 310 of offset body region 31. In one embodiment, doped regions 23 are placed in a portion of semiconductor layer 14 that is not exposed to a high current flux to avoid impacting drain current characteristics. In a further embodiment, doped regions 23 are spaced a distance 28 from a central line 123 located at a midpoint of doped regions 23. By way of example, distance 28 is in a range from about 0.25 microns to about 0.8 microns. Although doped regions 23 are depicted in this embodiment of the present invention, they are optional. In another embodiment, doped regions 23 are not formed. In this alternative embodiment, it is believed that minimal impact on drain resistance will occur, and a further reduction in cell size is achieved.

A fifth dielectric layer 61 is formed over portions of device 10, and comprises for example, silicon nitride having thickness of about 0.05 microns. An interlayer dielectric (ILD) layer 62 is formed over portions of device 10, and comprises for example, a deposited silicon oxide having a thickness of about 0.8 microns. An opening is formed in the dielectric layers to provide a contact to device 10 for source contact layer 63. As shown, a portion of major surface 18 is etched so that source contact layer 63 makes contact to both source regions 33 and body region 36. In one embodiment, source contact layer 63 comprises an aluminum silicon alloy or the like. A drain contact layer or conduction electrode 66 is formed on an opposing surface of region of semiconductor material 11, and comprises, for example, a solderable metal structure such a titanium—nickel—silver, chrome—nickel—gold, or the like.

The operation of device 10 proceeds as follows. Assume that source or input terminal 63 is operating at a potential $V_S$ of zero volts, spacer gate regions 57 receive a control voltage $V_G=2.5$ volts, which is greater than the conduction threshold of device 10, and drain or output terminal 66 operates at drain potential $V_D=5.0$ volts. The values of $V_G$ and $V_S$ cause body region 31 to invert under spacer gate regions 57 to form channels 45, which electrically connect source regions 33 to layer 17. A device current $I_{DS}$ flows from source terminal 63 and is routed through source regions 33, channels 45, layer 17, and semiconductor layer 14 to drain terminal 66. In one embodiment, $I_{DS}=1.0$ amperes. To switch device 10 to the off state, a control voltage $V_G$ of less than the conduction threshold of the device is applied to spacer gates 57 (e.g., $V_G<2.5$ volts). This removes channels 45 and $I_{DS}$ no longer flows through device 10.

Figure 2:
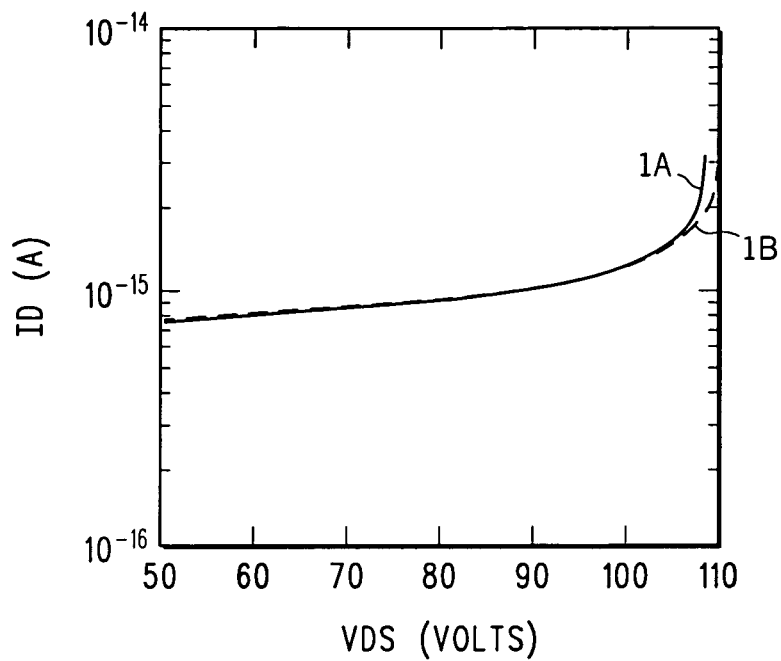
FIG. 2 is a semi-logarithmic graph showing drain current ($I_D$) in an off state as a function of breakdown voltage ($BV_{DSS}$) comparing the embodiment of FIG. 1 to a device having a standard body region.

FIG. 2 is a semi-logarithmic graph showing drain current ($I_D$) in an off state as a function of breakdown voltage ($BV_{DSS}$) comparing the present invention to a device having a standard body region. Line 1A shows $V_{DS}$ for device 10 having offset body region 31 in accordance with the present invention, and line 1B shows $V_{DS}$ for a device having a standard non-offset body region. As is evident in FIG. 2, device 10 has an equivalent or a nearly equivalent $V_{DS}$ characteristic.

Figure 3:
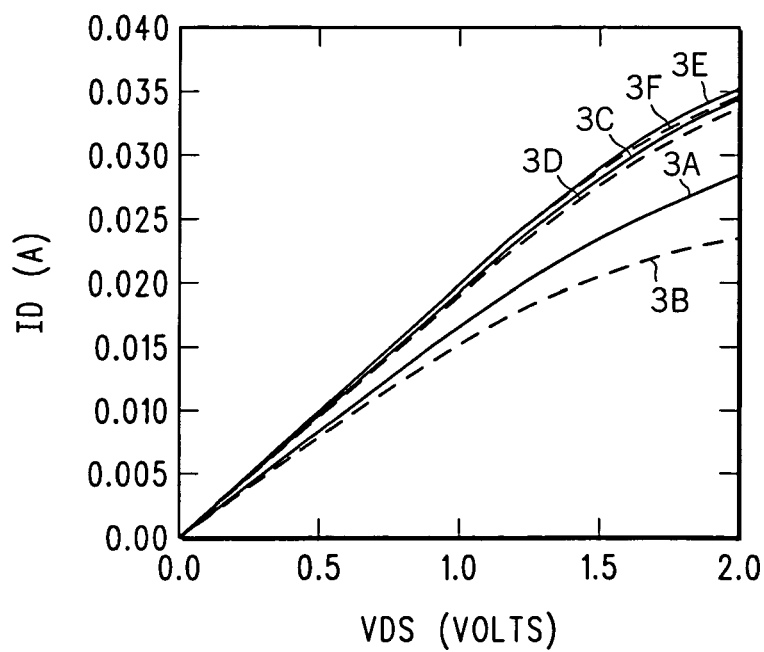
FIG. 3 is a graph showing drain current ($I_D$) in an on state as a function of $V_{DS}$ comparing the embodiment of FIG. 1 to a device having a standard body region.

FIG. 3 is a graph showing drain current ($I_D$) in an on state as a function of drain to source voltage ($V_{DS}$) at various gate to source voltages ($V_{GS}$) comparing the present invention to a device having a standard body region. In this analysis, device 10 has a cell size that is 8% smaller than an equivalently rated conventional device. Lines 3A (device 10) and 3B (conventional device) correspond to a $V_{GS}$ of 3 volts, lines 3C (device 10) and 3D (conventional device) correspond to a $V_{GS}$ of 4 volts, and lines 3E (device 10) and 3F (conventional device) correspond to a $V_{GS}$ of 5 volts. As is evident in FIG. 3, device 10 has a better drain current characteristic compared to a conventional device even with a smaller cell size.

Figure 4:
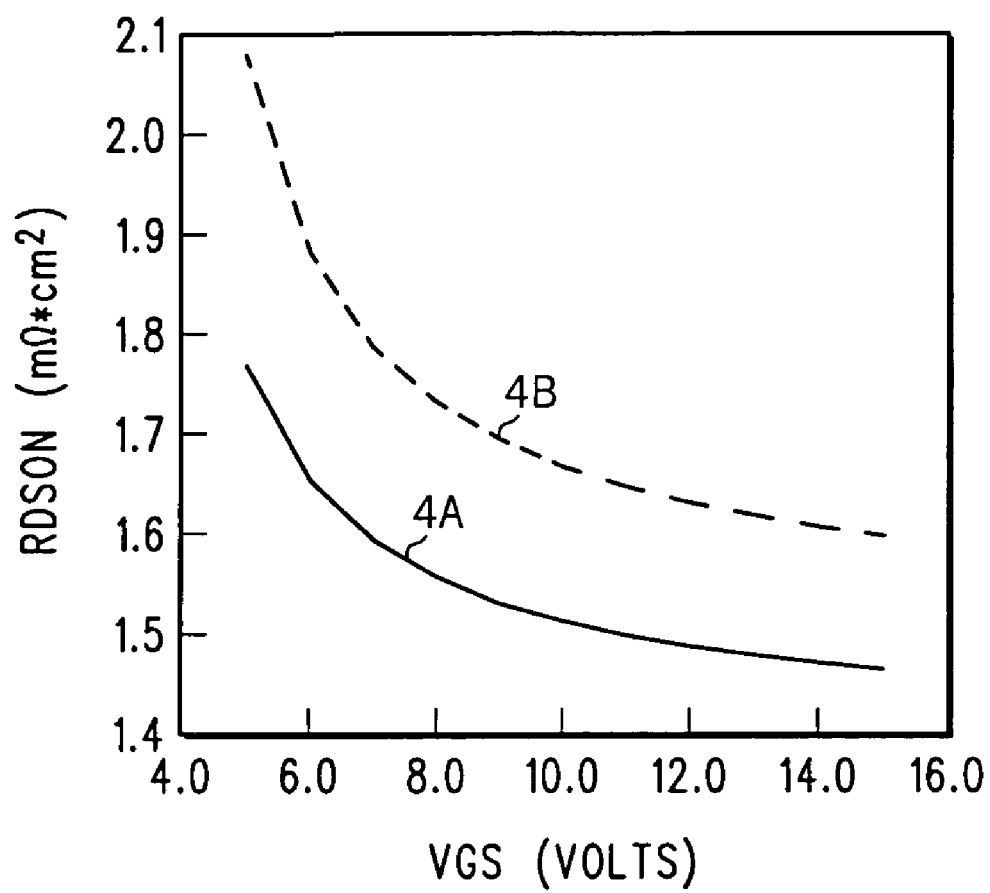
FIG. 4 is a graph showing on-resistance ($R_{DSON}$) as function of $V_{GS}$ comparing the embodiment of FIG. 1 to a device having a standard body region.

FIG. 4 is a graph showing on-resistance ($R_{DSON}$) as function of gate to source voltage ($V_{GS}$) with a $V_{DSON}$ of 0.75 volts comparing the present invention (line 4A) to a device having a standard body region (line 4B). As is evident in FIG. 4, device 10 has better on-resistance performance compared to a device having a standard body region.

Figure 5:
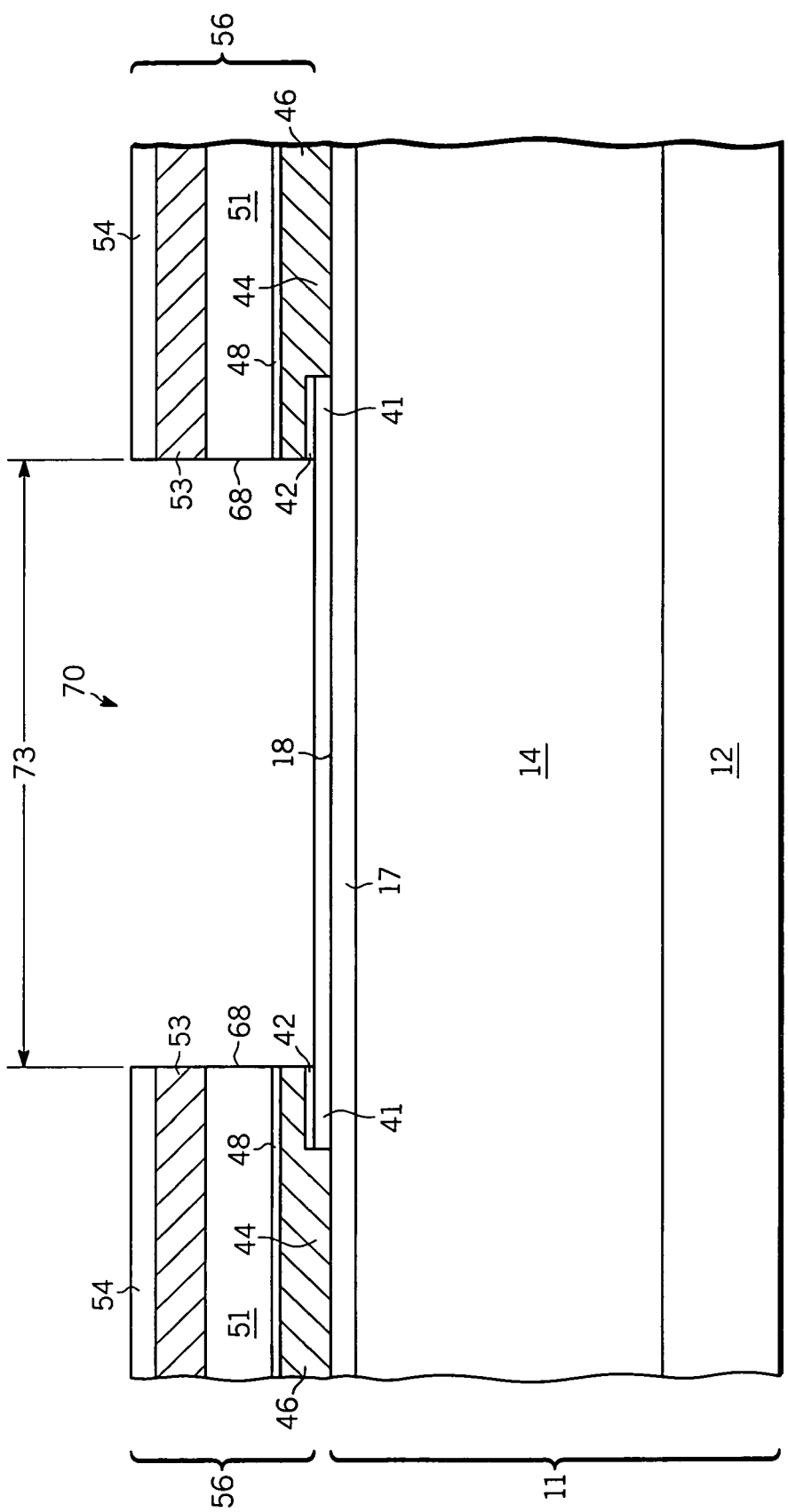
FIG. 5 illustrates a highly enlarged partial cross-sectional view of an embodiment of the present invention at an early stage of fabrication.

Turning now to FIGS. 5-9, a process for forming device 10 having an offset body region 31 in accordance with the present invention is described. FIG. 5 shows an enlarged partial cross-sectional view of device 10 at an early stage of fabrication. First dielectric layer 41 is formed over major surface 18, and comprises for example, a silicon oxide about 0.05 microns to about 0.2 microns thick. A thermal oxide grown at about 900 degrees Celsius is suitable. Next, second dielectric layer 42 is formed over dielectric 41, and comprises, for example, about 0.05 microns to about 0.1 microns of silicon nitride. Openings 44 are then formed in portions of dielectric layers 41 and 42 to expose portions of major surface 18. Openings 44 are formed using conventional photolithography and etch techniques.

Conductive layer 46 is then formed over second dielectric layer 42 and in openings 44 so that portions of conductive layer 46 are adjacent to major surface 18. When device 10 comprises an n-channel device, conductive layer 46 comprises about 0.1 microns of p-type polysilicon, and is either deposited doped or undoped. If conductive layer 46 is deposited initially undoped, conductive layer 46 is subsequently doped using, for example, ion implantation techniques. In one embodiment, conductive layer 46 is doped with a boron ion implant. A dose of about $5.0\times10^{15}$ to about $1.0\times10^{16}$ atoms/cm$^2$ with an implant energy of about 30 KeV is sufficient for doping conductive layer 46. In one embodiment, the boron dopant in conductive layer 46 will be diffused from conductive layer 46 into body of semiconductor material 11 to form doped regions 23. In an alternative embodiment, p-type dopant is ion implanted or deposited in openings 44 before conductive layer 46 is deposited.

Next, third dielectric layer 48 is formed over conductive layer 46, and fourth dielectric layer 51 is formed over third dielectric layer 48. Third dielectric layer 48 comprises, for example, silicon nitride (e.g., about 0.05 microns in thickness), and dielectric layer 51 comprises a deposited oxide (e.g., about 0.7 microns in thickness). Conductive layer 53 is then formed over fourth dielectric layer 51, and comprises for example, n-type polysilicon (e.g., about 0.3 microns in thickness). A protective layer 54 is formed over conductive layer 53, and comprises for example, about 0.15 microns of silicon nitride.

A photolithographic and etch step is done to etch through portions of layers 54, 53, 51, 48, 46 and 42 to provide an opening 70. This also forms pedestal stack structures 56, which are comprised of remaining portions of layers 42, 46, 48, 51, 53 and 54. In one embodiment, opening 70 has a width 73 on the order of about 5.0 microns to about 8.0 microns.

Figure 6:
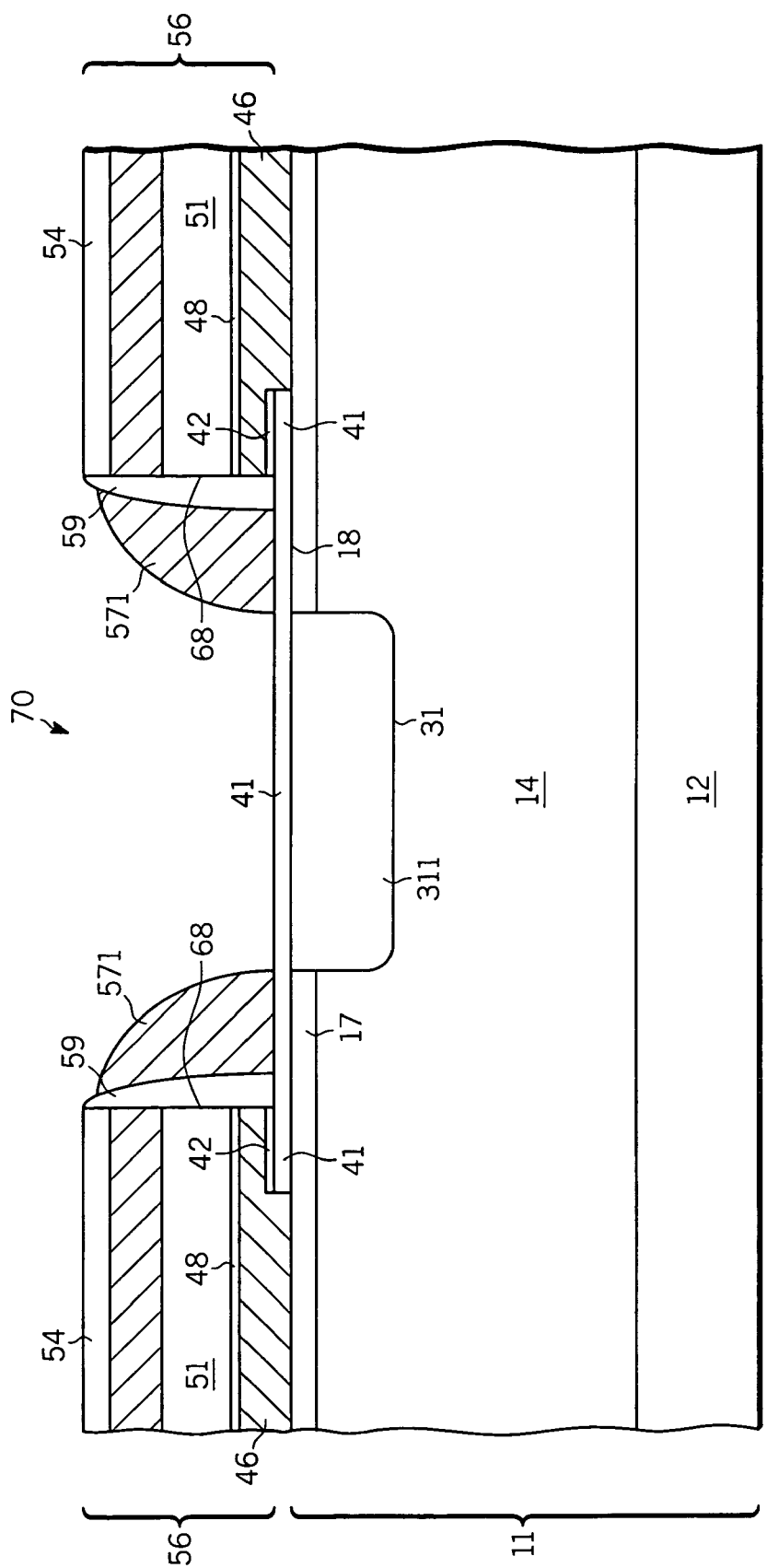
FIG. 6 illustrates a highly enlarged partial cross-sectional view of an embodiment of the present invention at a later stage of fabrication.

FIG. 6 shows an enlarged partial cross-sectional view of device 10 after additional processing steps that form dielectric spacers 59 and spacers 571. In one embodiment, a silicon nitride film is deposited over pedestal stack structures 56 and first dielectric layer 41. By way of example, a silicon nitride film about 0.1 microns thick is deposited using chemical vapor deposition techniques. Next, a conventional anisotropic etch back step is used to remove portions of the silicon nitride layer over pedestal stack structures 56 and first dielectric layer 41 while leaving portions of the silicon nitride layer on sidewalls or vertical surfaces 68 to form dielectric spacers 59.

A conformal layer is then deposited overlying device 10, and anisotropically etched to provide spacers 571 within opening 70 adjacent dielectric spacers 59. By way of example, the conformal layer comprises polysilicon having a thickness from about 0.2 microns to about 0.4 microns. In accordance with the present invention, the thickness of the conformal layer sets the thickness of spacers 571, which in turn sets distance 312 (shown in FIG. 1). For example, when thickness of spacers 571 is about 0.3 microns, distance 312 is about 0.3 microns. A p-type dopant is then introduced into semiconductor layer 14 through opening 70 to form portion 311 of offset body region 31, which is self-aligned to spacers 571. By way of example, an ion implant dose of about $1.0 \times 10^{13}$ atoms/cm$^2$ and an implant energy of about 120 KeV is suitable for a 50 volt device. Portion 311 is then annealed to diffuse and activate the dopant. By way of example, device 10 is exposed to 900 degrees Celsius for about 30 to 90 minutes.

Figure 7:
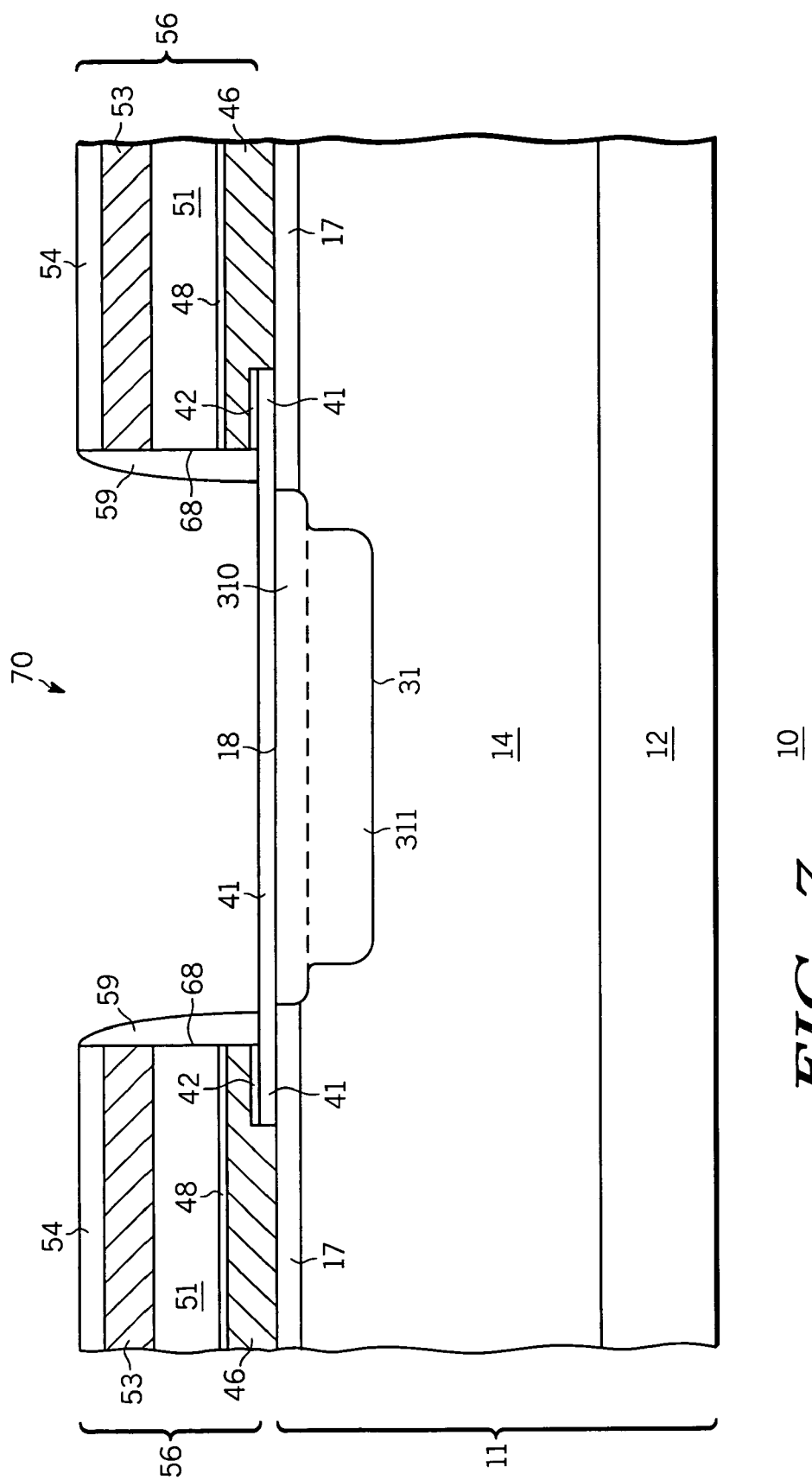
FIG. 7 illustrates a highly enlarged partial cross-sectional view of an embodiment of the present invention at a still later stage of fabrication.

FIG. 7 shows an enlarged partial cross-sectional view of device 10 after additional processing. Spacers 571 are removed, and additional p-type dopant is introduced into semiconductor layer 14 through opening 70 to form portion 310 of offset body region 31, which is self-aligned to dielectric spacers 59. That part of portion 310 within portion 311 is shown as a dashed line for sake of clarity, but as one skilled in the art understands, where portion 311 adjoins portion 310, the doping is typically continuous. By way of example, boron is implanted through opening 70 with an ion implant dose of about $1.0 \times 10^{13}$ atoms/cm$^2$ and an implant energy of about 60 KeV being suitable for a 50 volt device. Portion 310 is then annealed to diffuse and activate the dopant to form offset body region 31. In another embodiment, portions 310 and 311 are annealed together, with portion 311 being deeper within semiconductor layer 14 as a result of the higher ion implant energy used. In a further embodiment, a silicon oxide etch is used to remove that portion of dielectric layer 41 exposed within opening 70 after spacers 571 have been removed. A new oxide layer is then regrown for example, during the annealing of portion 311 by adding an oxidizing agent such as oxygen or steam to the gas flow. This new oxide layer acts as a screen to protect major surface 18 during the formation of portion 310.

Figure 8:
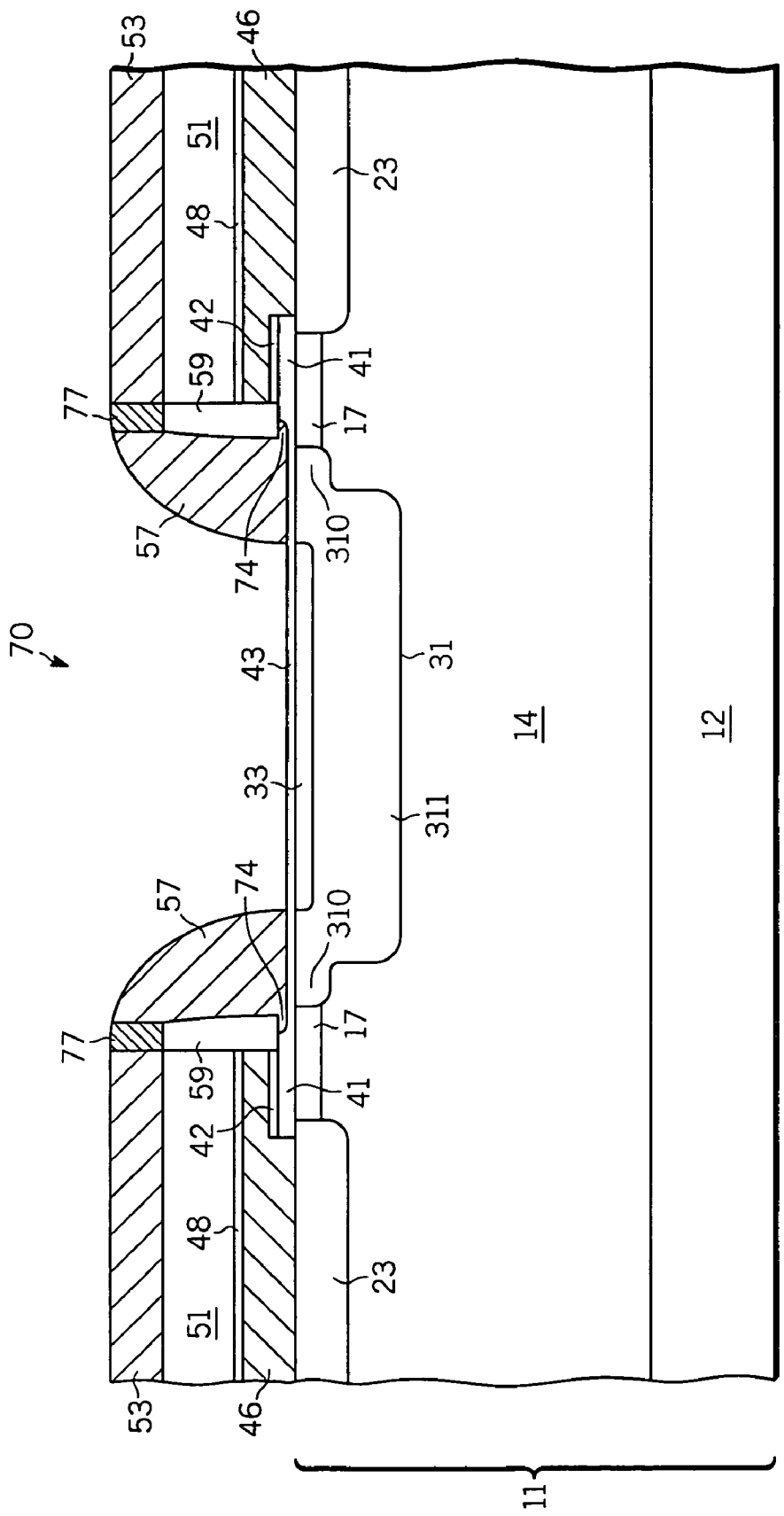
FIG. 8 illustrates a highly enlarged partial cross-sectional view of an embodiment of the present invention at a further stage of fabrication.

FIG. 8 shows an enlarged partial cross-sectional view of device 10 after further processing. A silicon oxide wet etch is used to remove portions of dielectric layer 41 within opening 70. By way of example, a diluted hydrofluoric acid (e.g., 50:1) is used to etch dielectric layer 41. In an exemplary embodiment, the etch time is prolonged (e.g., 8 to 15 minutes) in order to undercut or remove material from dielectric layer 41 from beneath dielectric spacers 59 to form recessed portions 74. Recessing dielectric layer 41 in this manner ensures that channels 45 (shown in FIG. 1) formed in body region 31 extend into semiconductor layer 14 to allow channel current to flow more efficiently. In an exemplary embodiment, portions 74 are recessed under dielectric spacers 59 a distance of less than about 0.1 microns. A thermal silicon oxide is then grown on major surface 18 within opening 70 to a thickness of about 0.08 microns to form gate dielectric layer 43.

Next, a conformal layer of semiconductor material is deposited overlying device 10, and the conformal layer is anistropically etched to provide spacer gates 57. By way of example, the conformal layer of semiconductor material comprises about 0.8 microns of n-type polysilicon, which may be doped during the deposition process or doped subsequently using ion implantation or other doping techniques. After spacer gates 57 are formed, an additional 0.015 microns of gate dielectric (e.g., silicon oxide) is added to the surface of spacer gates 57 and exposed portions of gate oxide 43.

In one embodiment, the etch step that forms spacer gates 57 also exposes protective layer 54 and the upper portions of dielectric spacers 59. Protective layer 54 and the upper portions of dielectric spacers 59 are then etched so that protective layer 54 is removed, and upper portions of dielectric spacers 59 are removed between spacer gates 57 and conductive layers 53. This leaves a gap between conductive layers 53 and spacer gates 57.

In a further step, conductive material such as polysilicon is deposited to provide connective conductive portions 77. Connective conductive portions 77 fill the gap formed during the removal of protective layer 54 and portions of dielectric spacers 59, and couple or electrically connect spacer gates 57 to conductive layers 53. An n-type doping step is then done to dope connective conductive portions 77, and to provide dopant for source regions 33. In an exemplary embodiment, an arsenic implant dose of $3.0 \times 10^{15}$ atoms/cm$^2$ with an implant energy of 80 KeV is used for this doping step. In one embodiment, a first anneal step is used at this point to activate and diffuse the various dopants to form body region 31, doped regions 23 and source region 33. By way of example, device 10 is exposed to a temperature of about 1030 degrees Celsius for about 45 seconds. In alternative embodiment, the dopants are activated and diffused at a later step as described below.

Figure 9:
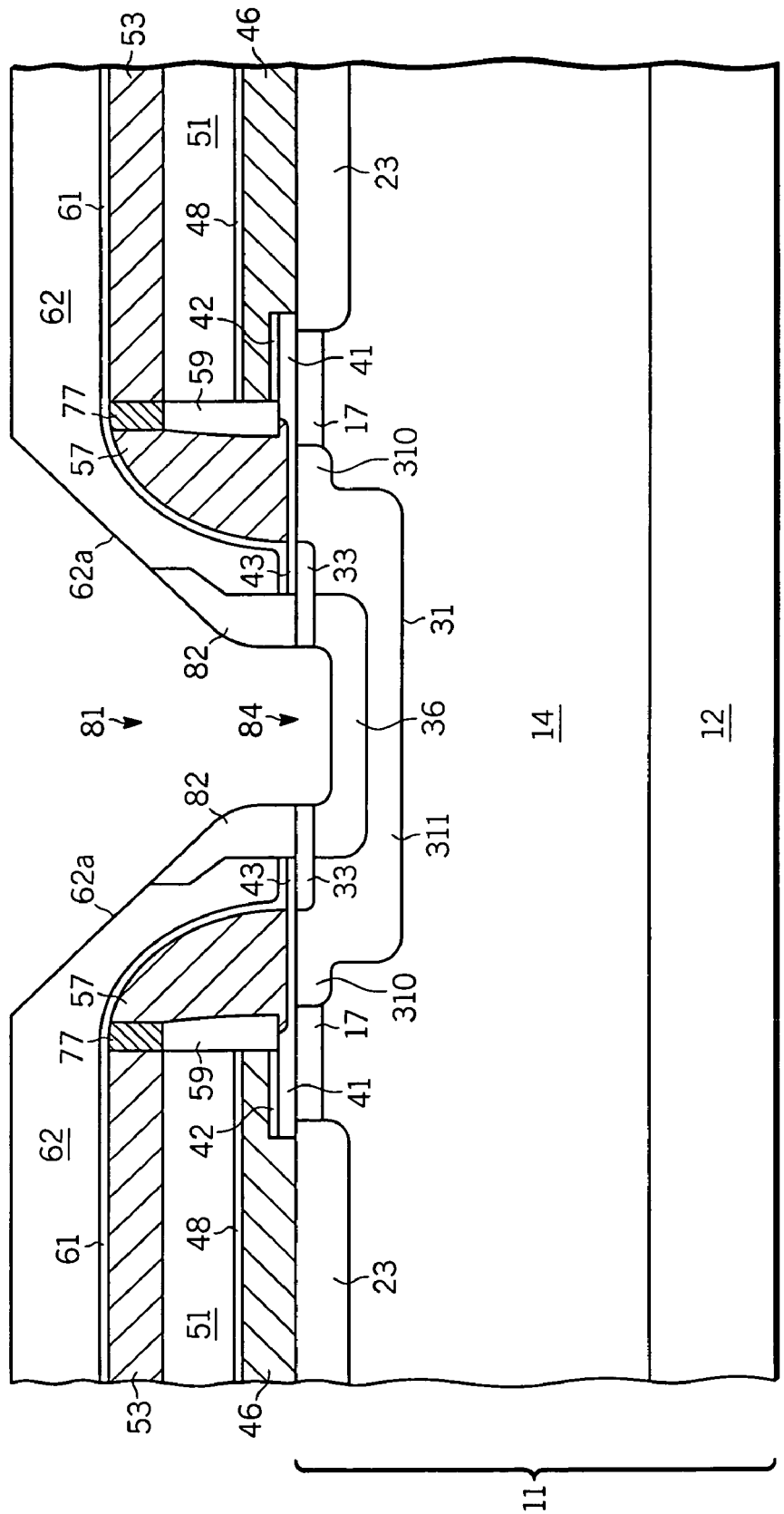
FIG. 9 illustrates a highly enlarged partial cross-sectional view of an embodiment of the present invention at a still further stage of fabrication.

FIG. 9 shows an enlarged partial cross-sectional view of device 10 after further steps in fabrication. Fifth dielectric layer 61 is deposited, and comprises for example, about 0.05 microns of silicon nitride. ILD layer 62 is then deposited over fifth dielectric layer 61. In an exemplary embodiment, ILD layer 62 comprises a deposited silicon oxide about 0.8 microns in thickness. An optional ILD taper etch is used to taper portions 62a of ILD layer 62, which helps with step coverage for subsequently formed layers.

Next, a conventional photolithographic and etch step is used to form contact opening 81, which exposes a portion of major surface 18. Contact region 36 is then formed through opening 81 using a p-type ion implantation step. By way of example, a boron ion implant dose of $3.0 \times 10^{14}$ atoms/cm$^2$ and an implant energy of 80 KeV is used. A conformal spacer layer is then deposited and etched to form spacers 82. In an exemplary embodiment, a 0.3 micron layer of silicon nitride is deposited and etched to form spacers 82. In one embodiment, a rapid anneal step is used at this point to activate and diffuse the various ion implants. For example, device 10 is exposed to a temperature of about 1030 degrees Celsius for about 45 seconds.

An etch step is then used to remove a portion of major surface 18 to form recessed portion 84. This allows source contact layer 63 to contact both source regions 33 and contact region 36, which shorts these regions together. Spacers 82 are then removed. In subsequent processing, source contact layer 63 is deposited and patterned. Substrate 12 is then optionally thinned, and drain contact layer 66 is deposited to provide the structure shown in FIG. 1. It is further understood that other conductive layers such as silicide layers may be formed before depositing source contact layer 63.

In view of all the above, it is evident that a novel device and methods of its manufacture are disclosed. Included, among other features, is a semiconductor device with offset body regions. Among other things, the offset regions allow for smaller cell spacings and improves drain current and drain resistance characteristics without impacting breakdown voltage.

Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

I claim:

1. A semiconductor device, comprising:
   a substrate having a major surface, wherein the substrate comprises a first conductivity type;
   a pedestal structure overlying a portion of the major surface, wherein the pedestal structure includes a dielectric material;
   a conductive material disposed along a side surface of the pedestal structure to define an edge of a first conduction electrode of the semiconductor device, wherein the first conduction electrode comprises a control electrode;
   an offset doped region of a second conductivity type formed in the major surface adjacent the first conduction electrode, wherein the offset doped region comprises a wider portion adjacent the major surface, and a narrower portion underlying the wider portion, and wherein the wider portion of the offset doped region forms a drain edge of a channel region when the semiconductor device is in operation, and wherein the control electrode overlaps portions of both the wider and the narrower portions of the offset doped region;
   a current carrying region of the first conductivity type formed in the offset doped region;
   a second doped region of the second conductivity type formed in the substrate external to the offset doped region and in proximity to and spaced apart from the drain edge of the channel region; and
   a first conductive layer formed as part of the pedestal structure and coupled to the second doped region.

2. The semiconductor device of claim 1, wherein the, substrate includes a semiconductor layer of a first conductivity type formed over the substrate, wherein the semiconductor layer has a lower doping concentration than the substrate.

3. The semiconductor device of claim 2 further comprising a second doped region of the first conductivity type formed adjacent the major surface adjacent the drain edge of the channel, wherein the second doped region has a greater doping concentration than the semiconductor layer.

4. The device of claim 2, wherein the semiconductor layer comprises silicon-germanium.

5. The semiconductor device of claim 1 wherein a second surface of the substrate forms a second conduction electrode.

6. The semiconductor device of claim 1, wherein the first conductive layer comprises polycrystalline silicon.

7. The semiconductor device of claim 1, wherein the second doped region is coupled to the current carrying region.

8. The semiconductor device of claim 1 wherein the wider portion is about 0.6 microns wider than the narrower portion.

9. The semiconductor device of claim 1, wherein the pedestal structure includes:
   a first dielectric layer formed over the top surface of the substrate;
   a second dielectric layer formed over the first dielectric layer; and
   a second conductive layer formed over the second dielectric layer, wherein the second conductive layer is coupled to the first conduction electrode.

10. A semiconductor device, comprising:
    a semiconductor substrate;
    a semiconductor layer of a first conductivity type formed over the semiconductor substrate and having a major surface;
    an offset body region of a second conductivity type disposed in the semiconductor layer, the offset body region having a first portion adjoining the major surface, and second portion underlying the first portion, the second portion stepped-in from sides of the first portion, wherein the first portion is for forming a channel of the semiconductor device;
    a current conducting region of the first conductivity type formed in the offset body region;
    a pedestal structure formed overlying the major surface, wherein the pedestal structure includes a dielectric material and a first conductive layer;
    a gate electrode formed along a side surface of the pedestal structure and adjacent the channel, wherein the gate electrode overlaps both the first and second portions of the offset body region; and
    a first doped region of the second conductivity type formed in the semiconductor layer external to the offset body region in proximity to the major surface and spaced apart from the offset body region, wherein the first conductive layer is electrically coupled to the first doped region.

11. The semiconductor device of claim 10 further comprising a second doped region of the first conductivity type formed adjacent the offset body region, wherein the second doped region has a higher dopant concentration than the semiconductor layer.

12. The device of claim 10, wherein the semiconductor layer comprises silicon-germanium.

13. The semiconductor device of claim 10, wherein the first portion is about 0.6 microns wider than the second portion.

14. The semiconductor device of claim 10 wherein the semiconductor substrate comprises the second conductivity type.

* * * * *